United States Patent
Zampardi, Jr. et al.

(10) Patent No.: US 9,842,674 B2
(45) Date of Patent: Dec. 12, 2017

(54) METHODS OF FORMING THIN FILM RESISTORS WITH HIGH POWER HANDLING CAPABILITY

(71) Applicant: Skyworks Solutions, Inc., Woburn, MA (US)

(72) Inventors: Peter J. Zampardi, Jr., Newbury Park, CA (US); Kai Hay Kwok, Thousand Oaks, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/197,380

(22) Filed: Jun. 29, 2016

(65) Prior Publication Data
US 2016/0307671 A1    Oct. 20, 2016

Related U.S. Application Data

(62) Division of application No. 13/308,071, filed on Nov. 30, 2011, now Pat. No. 9,406,741.

(60) Provisional application No. 61/493,617, filed on Jun. 6, 2011, provisional application No. 61/418,267, filed on Nov. 30, 2010.

(51) Int. Cl.
| | |
|---|---|
| *H01P 1/22* | (2006.01) |
| *H01C 1/16* | (2006.01) |
| *H01C 1/012* | (2006.01) |
| *H01C 1/14* | (2006.01) |
| *H01L 27/01* | (2006.01) |
| *H01L 49/02* | (2006.01) |
| *H01C 7/00* | (2006.01) |

(52) U.S. Cl.
CPC ............... *H01C 1/16* (2013.01); *H01C 1/012* (2013.01); *H01C 1/14* (2013.01); *H01C 7/006* (2013.01); *H01L 27/016* (2013.01); *H01L 28/20* (2013.01); *H01P 1/227* (2013.01)

(58) Field of Classification Search
CPC .................................. H01P 1/22; H01P 1/227
USPC .............................................. 333/81 A, 81 R
See application file for complete search history.

(56) References Cited

U.S. PATENT DOCUMENTS

| | | | |
|---|---|---|---|
| 4,272,739 A | | 6/1981 | Nesses |
| 5,039,961 A | * | 8/1991 | Veteran ................... H01P 1/227 |
| | | | 333/263 |
| 9,406,741 B2 | * | 8/2016 | Zampardi, Jr. ........ H01C 1/012 |

(Continued)

*Primary Examiner* — Stephen E Jones
(74) *Attorney, Agent, or Firm* — Knobbe Martens Olson & Bear LLP

(57) ABSTRACT

Designs and methodologies related to attenuators having a thin-film resistor assembly are disclosed. In some embodiments, the thin-film assembly can include a first and second thin-film resistor, each having a main portion with an input end and an output end. The input end of the first thin-film resistor is interconnected to the input end of the second thin-film resistors, and the output end of the first thin-film resistor is interconnected to the output end of the second thin-film resistor. The first and second thin-film resistors are disposed relative to one another so as to define a separation. The separation region reduces the likelihood of hot spot regions forming at or near the center of the thin-film structure and improves power handling capability for a given resistor width. Also disclosed are examples of how the foregoing features can be implemented in different products and methods of fabrication.

20 Claims, 10 Drawing Sheets

(56) References Cited

U.S. PATENT DOCUMENTS

2009/0231067 A1  9/2009  Yan et al.

* cited by examiner

METHODS OF FORMING THIN FILM RESISTORS WITH HIGH POWER HANDLING CAPABILITY

RELATED APPLICATIONS

This application is a divisional of U.S. patent application Ser. No. 13/308,071, now U.S. Pat. No. 9,406,741, titled "THIN FILM RESISTOR HAVING IMPROVED POWER HANDLING CAPABILITY" and filed on Nov. 30, 2011, which claims priority to U.S. Provisional Application No. 61/418,267, filed on Nov. 30, 2010, titled "THIN FILM RESISTOR HAVING IMPROVED POWER HANDLING CAPABILITY," and 61/493,617, filed on Jun. 6, 2011, titled "THIN FILM RESISTOR HAVING IMPROVED POWER HANDLING CAPABILITY," each of which is hereby incorporated herein by reference in its entirety.

BACKGROUND

Field

The present disclosure generally relates to attenuators, and, more particularly to attenuators having a thin-film resistor assembly.

Description of the Related Art

Attenuators can be utilized to attenuate an input signal and yield an output signal. Such an attenuator can be utilized in a number of applications, including radio-frequency applications such as fiber-optics, radar, microwave radio, and test and measurement applications. For such applications, it can be desirable to have attenuators of high return loss, good attenuation flatness, and/or high power handling capability. Keeping down the manufacturing cost (e.g., by reducing the die size) while achieving high performance such as power handling capability, can also be an important consideration in a competitive commercial market.

In some designs, improving the power handling capability of a resistive attenuator can be achieved by increasing the width of the series thin-film resistor at the expense of larger die size. However, increasing the width can leave the resistor vulnerable to hot-spotting at or near the center causing burn-out at lower powers.

SUMMARY

In some implementations, the present disclosure relates to a thin film resistor assembly having a first and a second thin film resistor, each having a main portion with an input end and an output end. Each thin-film resistor further includes at least one extension formed from the main portion and configured to be capable of being connected to a reference potential such as an electrical ground. The input end of the first thin-film resistor is interconnected to the input end of the second thin-film resistors, and the output end of the first thin-film resistor is interconnected to the output end of the second thin-film resistor. The first and second thin-film resistors can be disposed relative to one another so as to define a separation region that extends in a direction having a component parallel to an axis defined between the input and output ends of the first and second thin-film resistors. The separation region provides additional surfaces for the first and second thin-film resistors for flow of surface current.

In some embodiments, the first and second thin-film resistors can have a double tee configuration and the two tees in each of the thin-film resistors can be interconnected directly via a resistive material. In some embodiments, the first and second thin-film resistors can have a single-tee configuration.

According to a number of implementations, the present disclosure relates to an attenuator including a thin film resistor assembly formed on a first surface of a substrate. The thin-film resistor assembly can include a first and second thin-film resistor. In some embodiments, each thin-film resistor includes a main portion with an input and an output end, and at least one extension formed from the main portion configured to be capable of being connected to a reference potential. The first and second thin-film resistors can be further disposed relative to each other so as to define a separation region that extends in a direction having a component parallel to an axis defined between the input and output ends of the first and second thin-film resistors.

In some embodiments, the attenuator can be formed on a substrate including gallium arsenide. In some embodiments, the attenuator can be formed on a substrate including silicon. In some embodiments, other semiconductor materials can also be utilized as a substrate for the attenuator.

In some embodiments, the attenuator can further include a first and second signal ports formed adjacent to and in electrical contact with the input ends and output ends of the first and second thin-film resistors.

In some embodiments, the attenuator can further include a first and second contact pads formed adjacent to and in electrical contact with the at least one extensions of the first and second thin-film resistors. The contact pads can be in electrical connection with ground.

In some embodiments, the attenuator can have a metal layer formed on a second surface of the substrate and in electrical contact with the first and second contact pads. The metal layer and the first and second contact pads can be electrically connected by a metal plating on a plurality of vias that extend from the second surface of the substrate to the first and second contact pads.

In some embodiments, the metal layer of the attenuator formed on the second surface of the substrate can define an opening. The opening on the metal layer formed on the second surface can be substantially underneath the main portions of a first and second thin film resistors formed on the first surface of the substrate.

According to some implementations, the present disclosure relates to a packaged module, where the packaged module can include an attenuator implemented on a packaging substrate. In some embodiments, the attenuator can have a thin-film resistor assembly formed on a first surface of a substrate, where the thin-film resistor assembly can include a first and second thin-film resistor. In some embodiments, each thin-film resistor includes a main portion with an input and an output end, and at least one extension formed from the main portion configured to be capable of being connected to a reference potential. The first and second thin-film resistors can be disposed relative to each other so as to define a separation region that extends in a direction having a component parallel to an axis defined between the input and output ends of the first and second thin-film resistors.

In some embodiments, the packaged module can also have at least one connection configured to facilitate passage of signals to and from the attenuator.

In some embodiments, the packaged module can further include a packaging structure configured to provide protection for the attenuator. The packaging structure can be dimensioned to allow easier handling of the module and to provide easier access to and from the attenuator.

In some embodiments, packaged module can have a metal layer formed on a second surface of the attenuator substrate and in electrical contact with the at least one extension of each of the first and second thin-film resistor. In some embodiments, the metal layer formed on the second surface defines an opening that can be substantially underneath the main portions of a first and second thin film resistors formed on the first surface.

In some embodiments, the packing substrate of the packaged module can include a metal layer in electrical contact with the metal layer formed on the second surface of the attenuator substrate. In some embodiments, the metal layer on the packaging substrate defines an opening dimensioned to substantially overlap with the opening on the metal layer on the second surface of the attenuator substrate.

In accordance with some implementations, the present disclosure relates to a wireless device where the device can have at least one antenna configured to facilitate transmission and receiving of radio-frequency (RF) signals, a transceiver configured to process the RF signals, and an attenuator configured to provide attenuation for at least some of the RF signals. According to some embodiments, the attenuator includes a thin-film resistor assembly formed on a first surface of a substrate. In some embodiments, the thin-film resistor assembly includes a first and a second thin-film resistor, where each thin-film resistor has a main portion with an input and an output end, and at least one extension formed from the main portion configured to be capable of being connected to a reference potential. The first and second thin-film resistors can be disposed relative to each other so as to define a separation region that extends in a direction having a component parallel to an axis defined between the input and output ends of the first and second thin-film resistors.

In some embodiments, the wireless device further comprises a receptacle configured to receive a battery and to provide electrical connection between the battery and the attenuator.

According to the teachings of some implementations, the present disclosure relates to a method for fabricating a thin film assembly, where the method can include providing or forming a substrate, providing or forming a passivation layer on a first surface of the substrate, and forming a thin-film resistor assembly in the passivation layer on the first surface of the substrate. For example, the thin-film resistor assembly can include a first and second thin-film resistor. In some embodiments, each thin-film resistor includes a main portion with an input and an output end, and at least one extension formed from the main portion configured to be capable of being connected to a reference potential. The first and second thin-film resistors may be disposed relative to each other so as to define a separation region that extends in a direction having a component parallel to an axis defined between the input and output ends of the first and second thin-film resistors.

In a number of implementations, the present disclosure relates to a method of fabricating an attenuator, where the method can include forming a thin-film resistor assembly on a first surface of a substrate. In some embodiments, the thin-film resistor assembly includes a first and second thin-film resistor. Each thin-film resistor can include a main portion with an input and an output end, and at least one extension can be formed from the main portion configured to be capable of being connected to a reference potential. The first and second thin-film resistors can be disposed relative to each other so as to define a separation region that extends in a direction having a component parallel to an axis defined between the input and output ends of the first and second thin-film resistors. In some embodiments, the method further includes forming signal ports adjacent to and in electrical contact with the input ends and output ends of the first and second thin-film resistors. In some embodiments, the method further includes forming contact pads adjacent to and in electrical contact with the at least one extensions of the first and second thin-film resistors. In some embodiments, the method further includes forming electrical connections between the contact pads and a reference potential.

BRIEF DESCRIPTION OF THE DRAWINGS

Other aspects, features, and advantages of the present disclosure will become more fully apparent from the following detailed description, the appended claims, and the accompanying drawings in which like reference numerals identify similar or identical elements.

DETAILED DESCRIPTION OF SOME EMBODIMENTS

The headings provided herein, if any, are for convenience only and do not necessarily affect the scope or meaning of the claimed invention.

Figure 1:
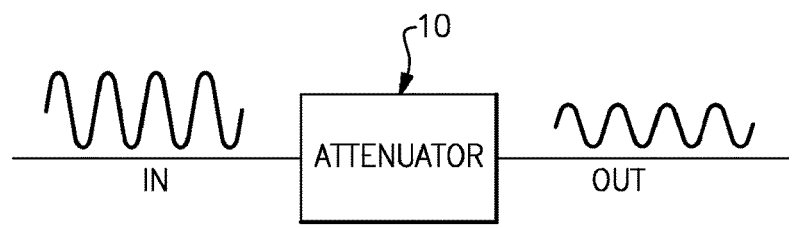
FIG. 1 schematically shows that an attenuator having one or more features of the present disclosure can be utilized in a radiofrequency (RF) and other applications where an attenuation of an input signal is desired.

FIG. 1 schematically shows an attenuator 10 that can be utilized to attenuate an input signal and yield an output signal. Such an attenuator can be utilized in a number of applications, including radio-frequency applications such as fiber-optics, radar, microwave radio, and test and measurement applications. For such applications, it can be desirable to have attenuators of high return loss, good attenuation flatness, and/or high power handling capability. Keeping down the manufacturing cost (e.g., by reducing the die size) while achieving high performance such as power handling capability, can also be an important consideration in a competitive commercial market.

In some designs, improving the power handling capability of a resistive attenuator can be achieved by increasing the width of the series thin-film resistor at the expense of larger die size. Also, increasing the width can leave the resistor vulnerable to hot-spotting at or near the center causing burn-out at lower powers.

In some implementations, the present disclosure relates to a thin-film resistor based attenuator having a design where, instead of increasing the width of the thin-film resistor, one or more of the following features can be implemented to improve performance such as improving the power handling capability.

In some embodiments of attenuators with a double-tee topology and relatively low attenuation values (e.g. <approximately 10 dB), a metal connection between the two tees can be removed. Such a removal can reduce or minimize impedance transition and thus allow power to move between two signal ports more smoothly.

In some embodiments, a thin-film resistor can be split into first and second parts (e.g., into two halves) so as to provide more edges for RF surface current to flow, thereby reducing the likelihood of one or more hot spot regions forming at or near the center of the thin-film structure.

An attenuator having one or more of the foregoing features can benefit from advantages that can include an increased power handling capability for a given resistor width. Such a capability can translate to a reduced die area and/or lower manufacturing cost for a given operating power level.

Figure 2:
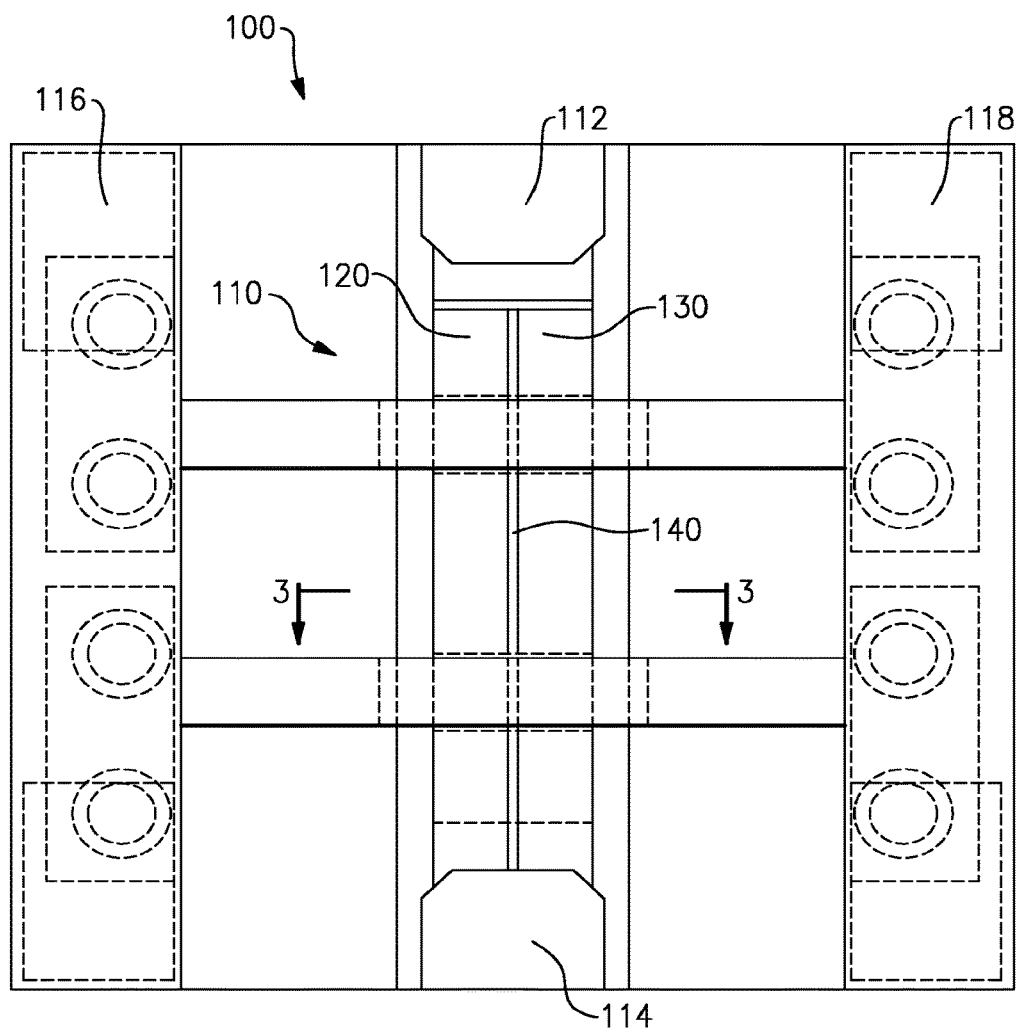
FIG. 2 shows that in some implementations, an attenuator can have first and second double-tees separated by an isolation gap.

FIG. 2 shows an example of an attenuator 100 having signal ports 112, 114 interconnected by a thin-film resistor structure 110 formed by two sets of double-tee thin-film resistors 120, 130. Each of the first and second double-tee structures 120, 130 can include two tee structures, where top portions of the "T" structure can be joined in series between the signal ports 112, 114, and legs of the "T" structure can be interconnected to their respective contact pads 116, 118. The contact pads 116, 118 can be interconnected to a reference potential such as a ground.

As further shown in FIG. 2, the first and second double-tee structures 120, 130 can be separated by a separation region 140. In some embodiments, first and second double-tee structures 120, 130 can be shaped similarly and be substantial mirror images of each other about an axis that extends between the signal ports 112, 114. In some embodiments, the separation region 140 can extend along the symmetry axis between the signal ports 112, 114.

Figure 3:
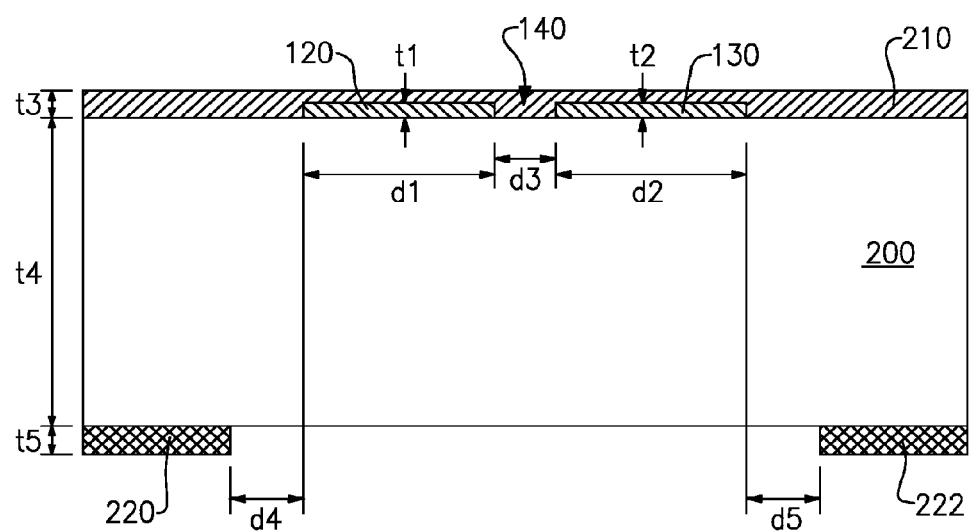
FIG. 3 depicts a sectional view of a portion of the attenuator of FIG. 2, showing the isolation gap in greater detail.

FIG. 3 depicts a sectional view along the top portions of the tee structures 120, 130 as indicated in FIG. 2. In FIG. 3, the separation region 140 is depicted as separating the top portions of the tee structures 120, 130 by a distance of d3. Lateral dimensions of the top portions of the tee structures 120, 130 are shown to be d1 and d2, respectively; and thickness dimensions are shown to be t1 and t2, respectively. In embodiments where the tee structures 120, 130 are substantially symmetrical, the dimensions d1 and t1 are can be substantially the same as the dimensions d2 and t2.

Referring to FIG. 3, the tee structures 120, 130 can be formed on a substrate having a thickness t4. The formed tee structures 120, 130 can also be covered and isolated from each other by a passivation layer 210. The passivation layer 210 can have a thickness indicated as t3.

Referring to FIG. 3, a metal layer (220, 222) for providing the reference potential (e.g., ground) for the legs of the tee structures 120, 130 via their contact pads (116, 118 in FIG. 1). The example metal layer (220, 222) can have a thickness of t5. As shown, the top portions of the tee structures 120, 130 and metal layer (220, 222) edges can be separated laterally by distances d4 and d5, respectively.

Table 1 lists various example ranges of dimensions that can be implemented for the example structure depicted in FIG. 3. Other dimension ranges can also be implemented. Table 2 lists various example materials that can be used for the example structure depicted in FIG. 3. Other materials can also be utilized.

TABLE 1

| Dimension | Approximate range |
|---|---|
| t1 | 50-1400 nm |
| t2 | 50-1400 nm |
| t3 | 0.5-1 μm |
| t4 | 100-125 μm |
| t5 | 3-5 μm |
| d1 | 40-60 μm |
| d2 | 40-60 μm |
| d3 | 3-10 μm |
| d4 | 20-50 μm |
| d5 | 20-50 μm |

TABLE 2

| Component | Example material |
|---|---|
| Substrate (200) | GaAs, Silicon |
| Resistive material (120, 130) | Tantalum nitride, Nickel chromium, Tungsten silicon nitride, Titanium tungsten nitride, Cermet (ceramic metal) |
| Passivation layer (210) | Silicon nitride, silicon dioxide |
| Metal layer (220, 222) | Gold, copper |

Figure 4:
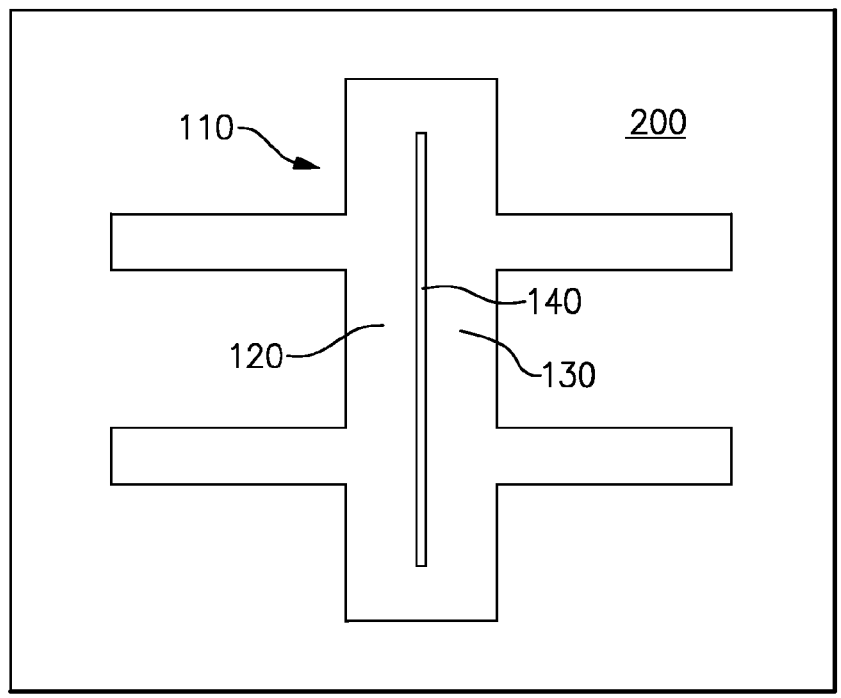
FIG. 4 shows an example pattern of resistive material that can be formed on a substrate to fabricate the example attenuator of FIG. 2.

FIGS. 4-9 show example stages and methods of fabrication that can yield the example attenuator described in reference to FIGS. 2 and 3. In FIG. 4, a pattern of the thin-film resistive material layer 110 is shown to be formed on the substrate 200. The resistive material layer 110 is shown to include the two double-tee structures 120, 130, with the separation region 140 defined therebetween.

Figure 5:
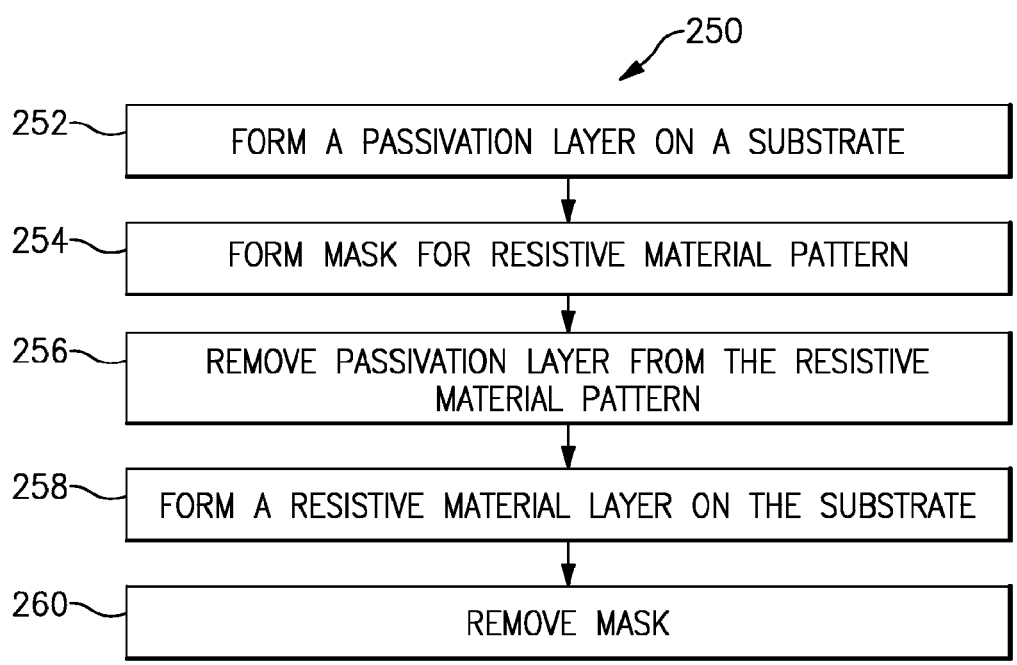
FIG. 5 shows an example process that can be implemented to form the resistive material pattern of FIG. 4.

FIG. 5 shows an example process 250 that can be implemented to form the thin-film resistive material layer 110. In block 252, a passivation layer (e.g., silicon nitride) can be formed on a substrate (e.g., GaAs). In some implementations, such a silicon nitride layer can be deposited on a GaAs substrate with insulating areas created by ion implantation.

In block 254, a mask having a pattern for the resistive material can be formed on the passivation layer. In block 256, a portion of the passivation layer where the resistive material is to be deposited can be removed. In some implementations, such a mask formation for deposition of the resistive material can be achieved by utilizing one or more known photolithography techniques (e.g., application of a photoresist; exposure of the photoresist according to the mask for the resistive material pattern; removal of the photoresist in the region(s) for resistive material; and etching of the passivation layer in the photoresist opening(s)).

In block 258, a resistive material layer can be formed on the substrate as defined by the foregoing mask. In some implementations, a resistive material such as tantalum nitride can be deposited by a technique such as a DC magnetron reactive sputtering.

In block 260, the previously formed mask can be removed so as to yield the resistive material pattern formed on the substrate.

Figure 6:
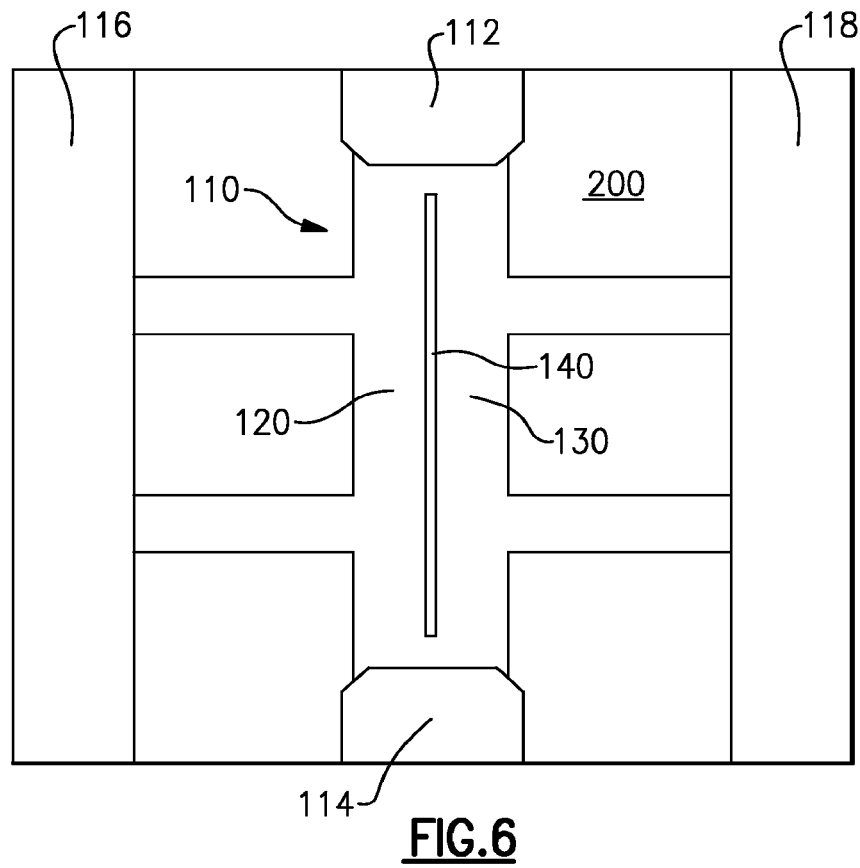
FIG. 6 shows an example pattern of electrical contacts that can be formed to fabricate the example attenuator of FIG. 2.
Figure 7:
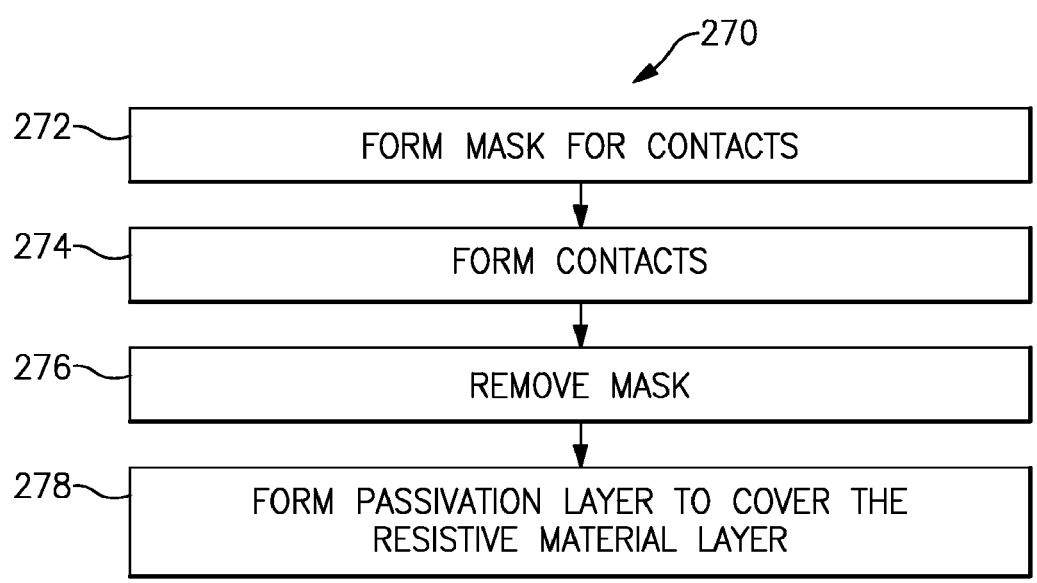
FIG. 7 shows an example process that can be implemented to form the electrical contacts of FIG. 6.

In FIG. 6, the signal ports 112, 114 and contact pads 116, 118 are shown to be formed so as to provide electrical connections for the operation of the resistive material layer 110. FIG. 7 shows an example process 270 that can be implemented to form the electrical contacts shown in FIG. 6. In block 272, a mask for the electrical contacts can be formed. In block 274, the contacts can be formed as defined by the mask. In some implementations, a metal (e.g., gold) can be deposited so as to form the contacts by a technique such as an electron beam evaporation. In block 276, the contact-defining mask can be removed so as to yield the electrical contacts.

In some implementations, portions of the electrical contacts are formed above, thus in connection with, their respective portions of the thin-film resistive film layer 110. Upon such formation of electrical connections, the remainder of the thin-film resistive film layer 110 can be covered with a passivation material. Thus, as shown in FIG. 7, additional passivation material can be provided so as to form the passivation layer 210 (FIG. 3) that substantially covers the thin-film resistive film layer 110.

Figure 8:
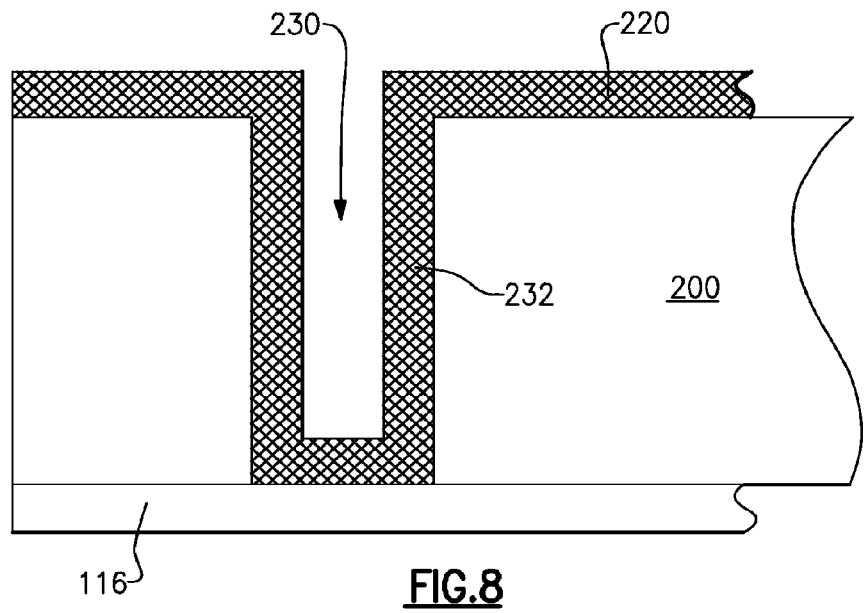
FIG. 8 shows an example of how some of the electrical contacts of FIG. 6 can be interconnected to a backside of the substrate to fabricate the example attenuator of FIG. 2.
Figure 9:
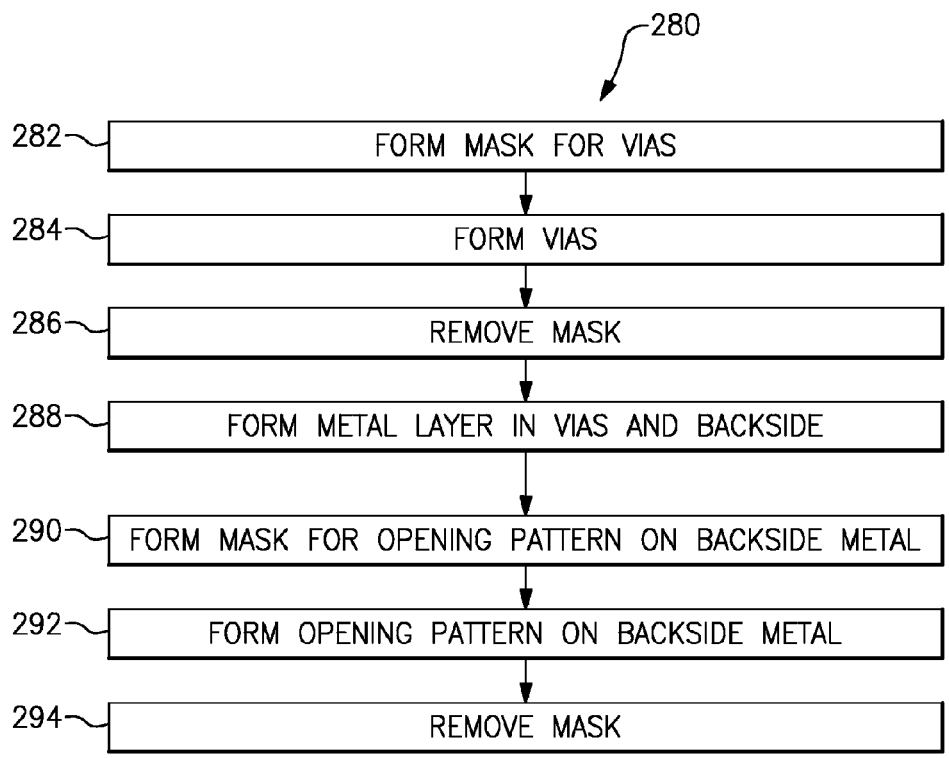
FIG. 9 shows an example process that can be implemented to form the backside interconnections of FIG. 8.

As described herein the contact pads 116, 118 (FIGS. 2 and 6) can be connected to the backside metal layer (220, 222) for a reference potential such as a ground potential. FIG. 8 shows an example of such a connection between the contact pad (116) on the front side of the substrate 200 and the metal layer 220 on the backside of the substrate 200. FIG. 9 shows an example process 280 that can be implemented to form such an electrical connection.

In block 282, a mask for formation of one or more vias can be formed on the backside of the substrate 200. In block 284, one or more vias can be formed as defined by the mask. In some implementations, such vias (230 in FIG. 8) can be formed by a technique such as dry etching.

In block 286, the mask for via-formation can be removed. In block 288, a metal layer can be formed (e.g., plating) in the vias and on the backside of the substrate 200. In FIG. 9, the metal layer in the vias 230 is indicated as 232, and the metal layer on the backside of the substrate 200 is indicated as 220.

In some implementations, it may be desirable to form one or more openings on the metal layer 220 on the backside. Thus, in block 290, a mask that defines such an opening pattern can be formed on the backside metal layer 220. In block 292, the one or more openings defined by the mask can be formed (e.g., etching). In block 294, the mask can be removed so as to yield desired openings formed on the backside metal layer 220.

Figure 10:
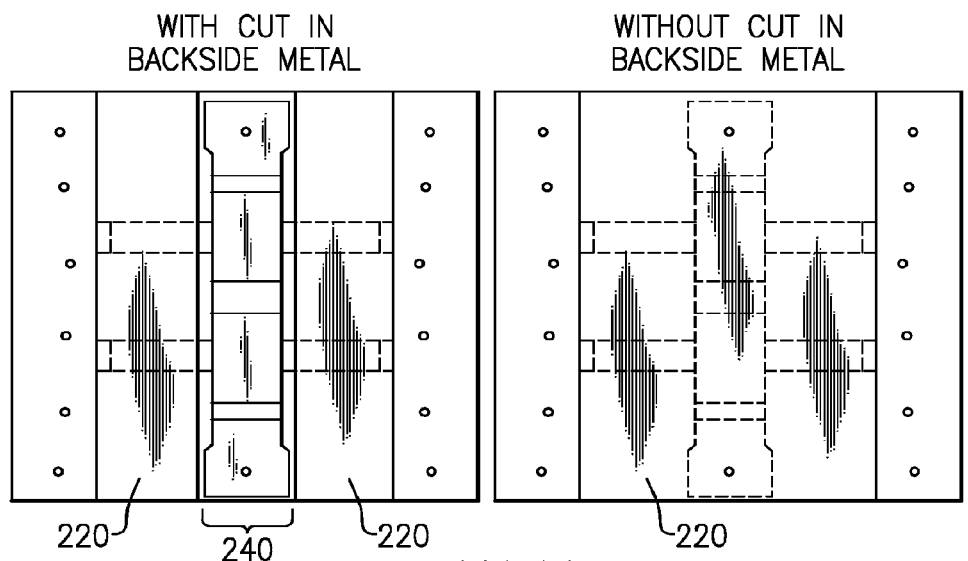
FIG. 10 shows an example of an opening that can be formed on the backside metal layer of an example attenuator of FIG. 2.
Figure 11:
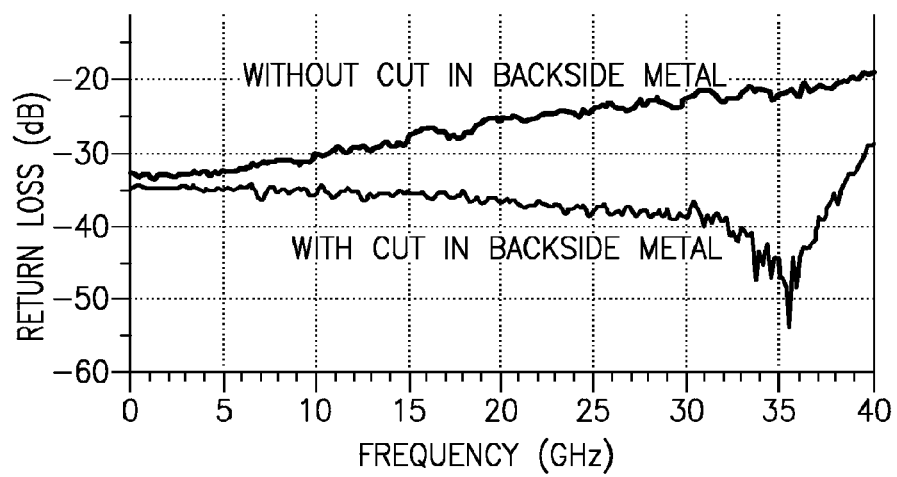
FIG. 11 shows a graph demonstrating improved return loss performance of an example attenuator having a backside metal layer opening.

Referring to FIG. 10, such an opening (indicated as 240) can be created on the backside metal layer 220. In some embodiments, the opening can substantially correspond in location to the top portions of the thin film resistor T structures. A backside metal layer opening 240 can be created as a part of the example process 280 described above. FIG. 11 shows that attenuators having such a backside metal layer opening 240 may demonstrate improved attenuator return loss performance, especially at higher frequencies. The example plots shown in FIG. 11 were obtained from measurements of un-mounted attenuator dies. In some implementations, such an opening (e.g., 240 in FIG. 10) and the thin-film structure being on opposite surfaces of a substrate can result in lower capacitance associated with the attenuator, which can in turn contribute to the improved return loss performance.

In some embodiments, an attenuator having one or more features as described herein can be formed in a die having lateral dimensions less than about 1 mm×1 mm. Such an attenuator can be configured to provide a relatively high power handling capability (e.g., up to about 2 W). Such an attenuator can also be configured to provide different attenuations (e.g., about 0 dB to 30 dB).

Figure 12:
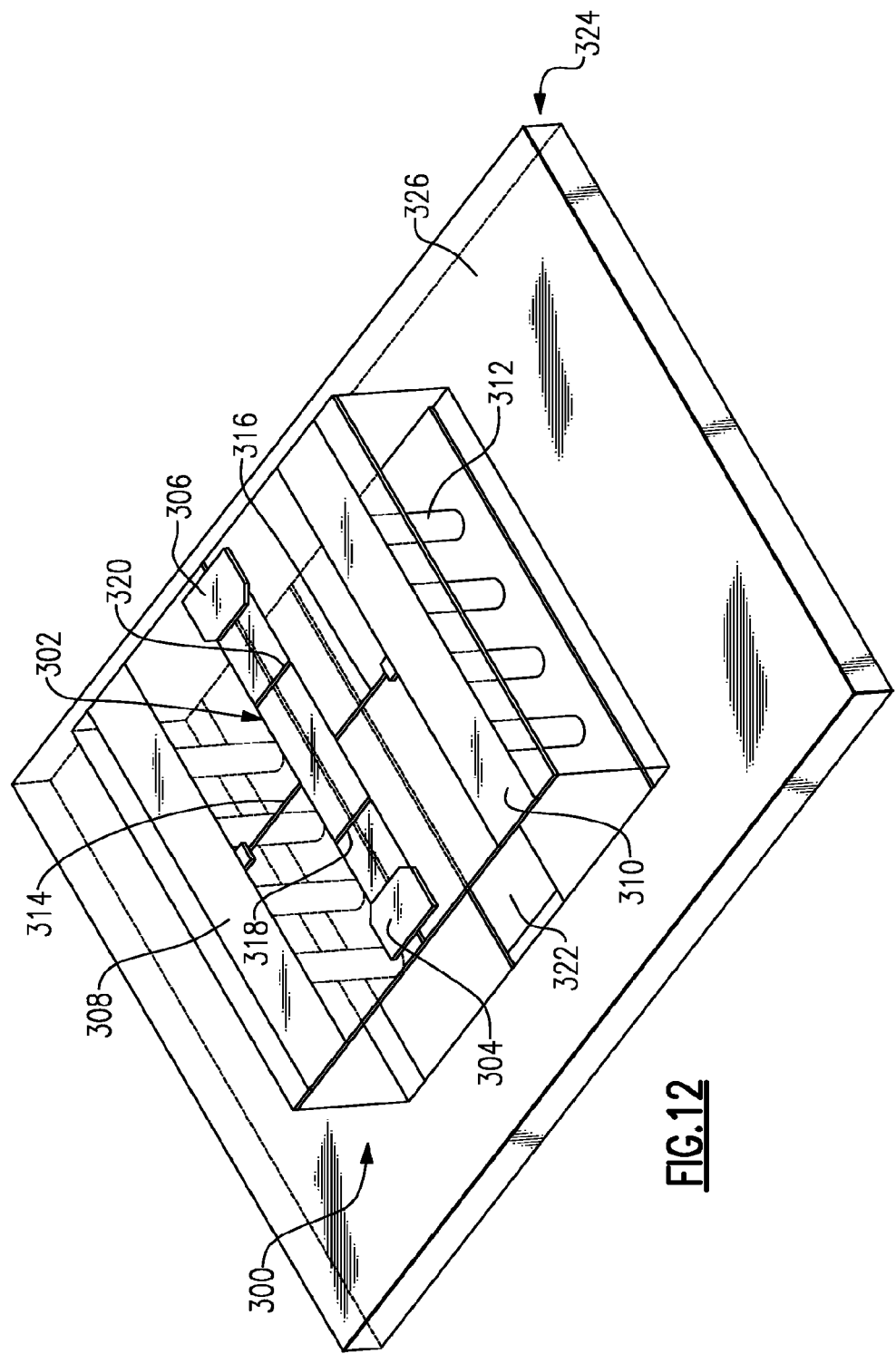
FIG. 12 shows an example RF attenuator configured to provide an attenuation value of about 1 dB.
Figure 13:
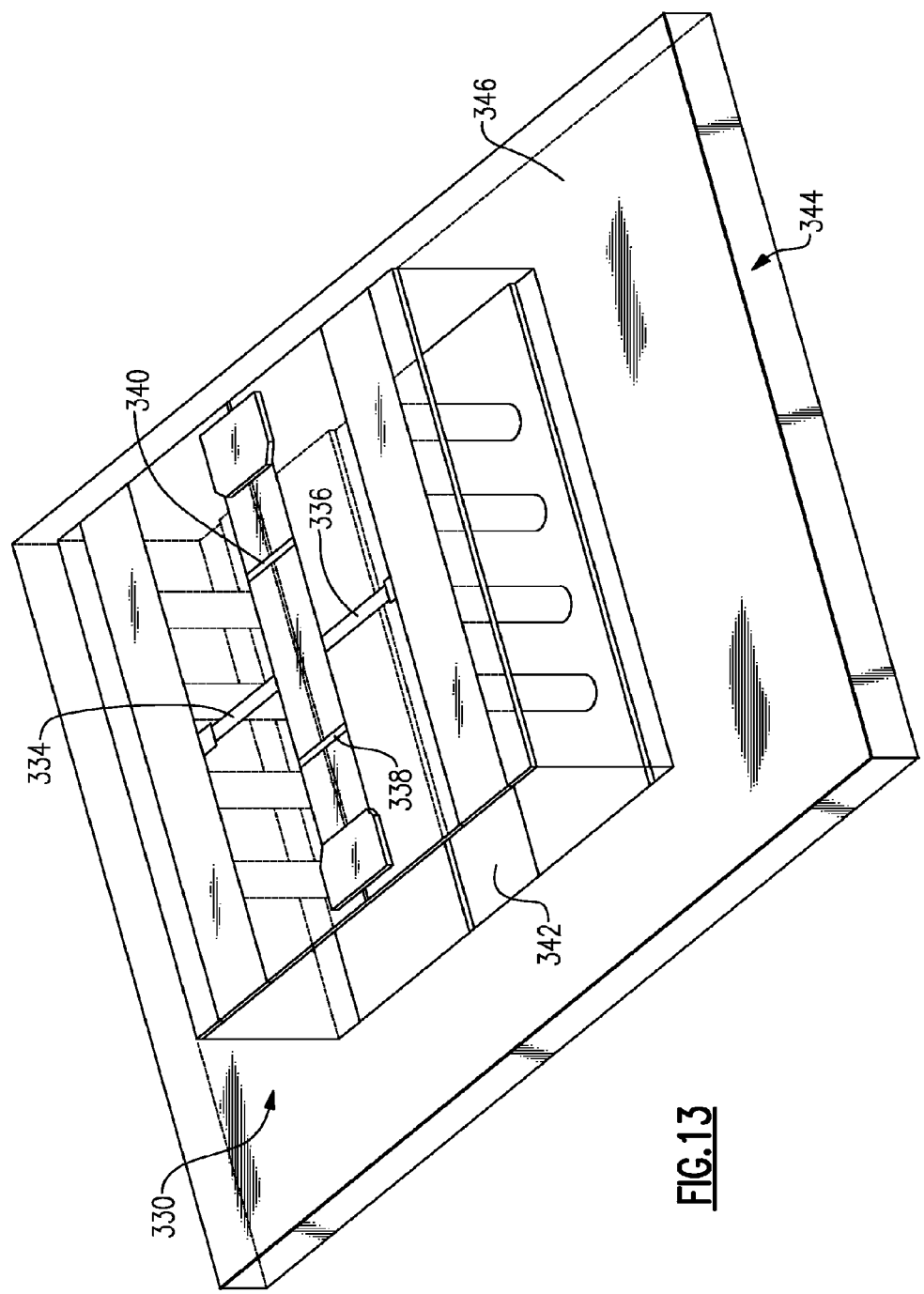
FIG. 13 shows an example RF attenuator configured to provide an attenuation value of about 2 dB.
Figure 14:
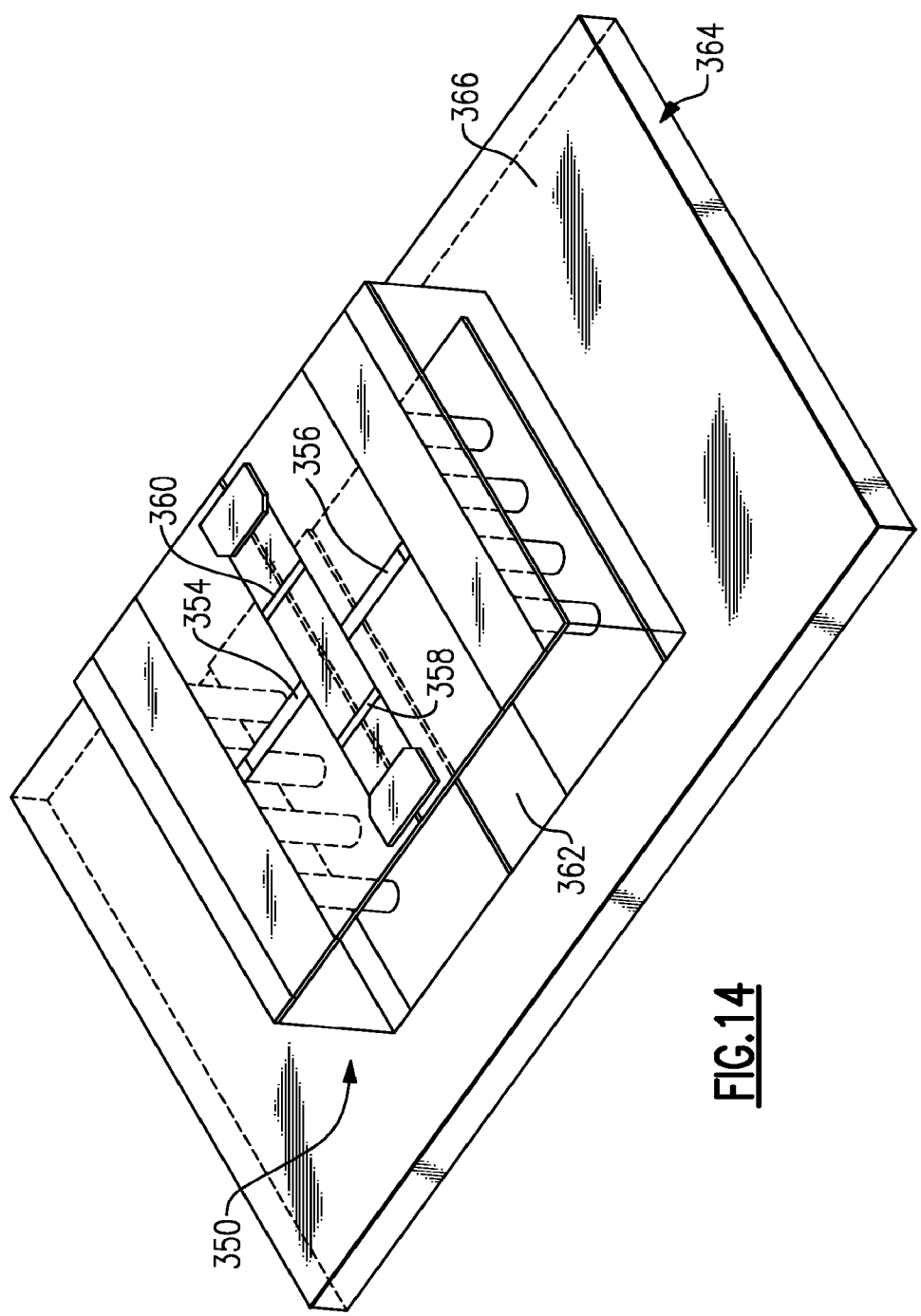
FIG. 14 shows an example RF attenuator configured to provide an attenuation value of about 3 dB.

FIGS. 12-14 show that in some embodiments, an attenuator having one or more features as described herein can have a single-tee configuration. Similar to the double-tee topology example described herein, a metal connection between the two single-tees can be removed; and such removal can reduce or minimize impedance transition and thus allow power to move between two signal ports more smoothly.

Furthermore, FIGS. 12-14 depict attenuators, indicated as 300, 330 and 350, mounted on packaging substrates, indicated as 324, 344 and 364. The packaging substrates, 324, 344 and 364, can include a topside metal layer, indicated as 326, 346, and 366. Packaging substrates can include, for example, laminate substrates. In some embodiments, an opening can be formed on the topside metal layer of the packaging substrate, indicated as 322, 342 and 362 in FIGS. 12-14. As shown in FIGS. 12-14, when an attenuator is mounted onto a packaging substrate, a packaging substrate topside metal layer opening can overlap at least in part with an attenuator backside metal layer opening, such as the attenuator backside metal layer opening 240 depicted in FIG. 10. In some implementations, formation of such an opening in the packaging substrate topside metal layer can enable a mounted attenuator (having an opening (e.g., 240 in FIG. 10) on its backside metal layer) to retain its improved return loss feature.

FIG. 12 shows an example of a single-tee topology attenuator 300 configured to provide an attenuation value of about 1 dB. FIG. 13 shows an example of a single-tee topology attenuator 330 configured to provide an attenuation value of about 2 dB. FIG. 14 shows an example of a single-tee topology attenuator 350 configured to provide an attenuation value of about 3 dB.

Referring to FIG. 12, the attenuator 300 can include signal ports 304, 306 interconnected by a thin-film resistor structure 302 formed by two sets of single-tee thin-film resistors. A first single-tee resistor can include a shunt 314 that provides a resistive pathway to a ground pad 308. Similarly, a second single-tee resistor can include a shunt 316 that provides a resistive pathway to a ground pad 310. Each of the ground pads 308 and 310 can be connected to a ground plane through one or more vias 312 having a metal layer as described herein.

As further shown in FIG. 12, the first and second single-tee structures can be separated by a separation region similar to the example described in reference to FIG. 2. In some embodiments, first and second single-tee structures can be shaped similarly and substantial mirror images of each other about an axis that extends between the signal ports 304, 306. In some embodiments, such a separation region can extend along the symmetry axis between the signal ports 304, 306.

Referring to FIGS. 13 and 14, the example 2-dB and 3-dB attenuation configurations can include signal ports, ground pads and via-based ground connections that can be similar to those described in reference to FIG. 12. In the example 2-dB attenuator 330 (FIG. 13), a thin-film resistor structure can be formed by two sets of single-tee thin-film resistors. A first single-tee resistor can include a shunt 334 that provides a resistive pathway to its corresponding ground pad; and a second single-tee resistor can include a shunt 336 that provides a resistive pathway to its corresponding ground pad. Similarly, in the example 3-dB attenuator 350 (FIG. 14), a thin-film resistor structure can be formed by two sets of single-tee thin-film resistors. A first single-tee resistor can include a shunt 354 that provides a resistive pathway to its corresponding ground pad; and a second single-tee resistor can include a shunt 356 that provides a resistive pathway to its corresponding ground pad.

As further shown in FIGS. 13 and 14, the first and second single-tee structures in each of the attenuators 330, 350 can be separated by a separation region similar to the example described in reference to FIG. 2. In some embodiments, first and second single-tee structures can be shaped similarly and substantial mirror images of each other about an axis that extends between the corresponding signal ports. In some embodiments, such a separation region can extend along the symmetry axis between the corresponding signal ports.

In the examples shown in FIGS. 12-14, the shunt structures are depicted as having different dimensions (e.g., different widths) so as to vary the amount of power shunted to the ground. In some embodiments, such shunting can be controlled by a shunt's dimension, its material, or some combination thereof.

In some embodiments, one or more resistive strips can be provided between two signal ports. In FIG. 12, two of such resistive strips are indicated as 318 and 320; in FIG. 13, as 338 and 340; and in FIG. 14, as 358 and 360. Such resistive strips are also shown in FIG. 2.

In examples shown in FIGS. 12-14, the resistive strips are depicted as having different dimensions (e.g., different widths) so as to provide additional variation in the resistance between the signal ports. In some embodiments, such additional variation in resistance can be controlled by a resistive strip's dimension, its material, or some combination thereof.

Figure 15:
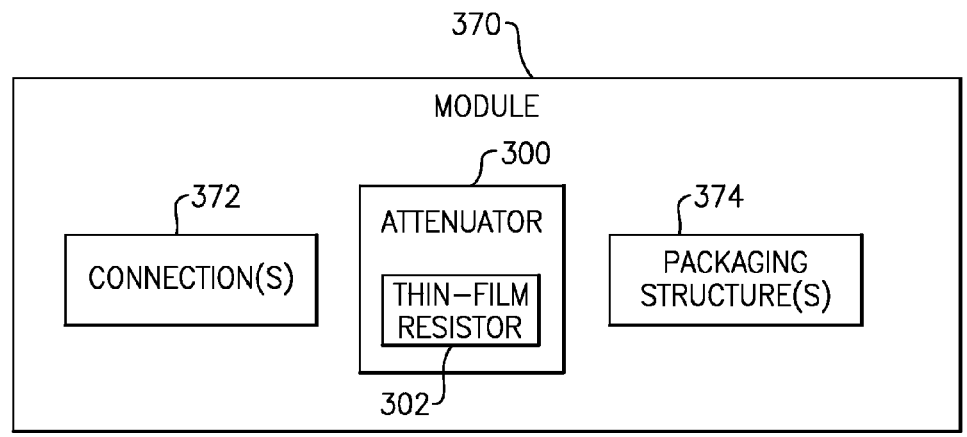
FIG. 15 shows an example packaged module comprising an example attenuator of FIG. 12.

FIG. 15 shows that in some embodiments, an attenuator having one or more features described herein can be implemented in a packaged module 370. In such embodiments, the attenuator 300 can include a thin-film resistor assembly 302 having one or more features as described herein. Such a packaged module can further include one or more connections 372 configured to facilitate passage of signals and/or power to and from the attenuator 300. Such a module can further include one or more packaging structures 374 that provide functionality such as protection (e.g., physical, electromagnetic shielding, etc.) for the attenuator 300. In some embodiments, the connections 372 can include conductive paths such as bond wires to accommodate wirebond-implementation modules, and/or conductive traces to accommodate flipchip-implementation modules.

Figure 16:
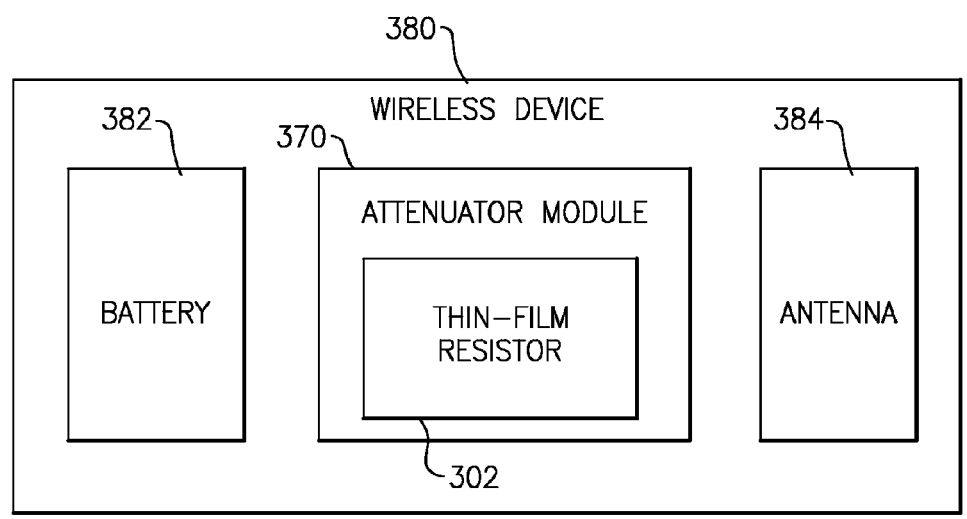
FIG. 16 shows an example wireless device having an example attenuator of FIG. 12 or an example packaged module of FIG. 15.

FIG. 16 shows that in some embodiments, a component having one or more features described herein can be included in a wireless device 380 such as a cellular phone, a smart phone, etc. In FIG. 16, a packaged attenuator module 370 is depicted as being part of the wireless device 380; and such a module is shown to include a thin film resistor assembly 302 having one or more features as described herein. In some embodiments, an unpackaged attenuator having similar functionality can also be utilized to achieve similar functionalities. The wireless device 380 is depicted as including other common components such as antenna 384, and also configured to receive a power source such as a battery 382.

It will be understood that although various examples described herein are in the context of single and double tee configures, one or more features of the present disclosure can be implemented in other attenuator configurations.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A thin-film resistor assembly, comprising:
   a substrate;
   a first thin-film resistor disposed on a first surface of the substrate and including a first main portion extending from a first signal port to a second signal port, and one or more extensions extending from the first main portion;

a second thin-film resistor disposed on the first surface of the substrate and including a second main portion extending from the first signal port to the second signal port, and one or more extensions extending from the second main portion, the first main portion separated from the second main portion by a separation region;

a plurality of contact pads formed on a second surface of the substrate opposite the first surface, the plurality of contact pads configured to provide a reference potential to the one or more extensions of the first thin-film resistor and to the one or more extensions of the second thin-film resistor; and at least one metal layer formed on the second surface of the substrate and in electrical contact with the plurality of contact pads, the at least one metal layer defining an opening that is substantially underneath the first main portion and the second main portion.

2. The thin-film resistor assembly of claim 1 wherein the reference potential is ground.

3. The thin-film resistor assembly of claim 1 further comprising a plurality of vias that extend through the substrate to connect the plurality of contact pads to the one or more extensions of the first thin-film resistor and to the one or more extensions of the second thin-film resistor.

4. The thin-film resistor assembly of claim 1 wherein the separation region extends substantially parallel to the first main portion and to the second main portion.

5. The thin-film resistor assembly of claim 1 wherein the separation region provides the first thin-film resistor and the second thin-film resistor with additional surfaces for flow of surface current.

6. The thin-film resistor assembly of claim 1 wherein the first thin-film resistor and the second thin-film resistor each have a double-tee configuration.

7. The thin-film resistor assembly of claim 1 wherein the one or more extensions of the first thin-film resistor are isolated from the one or more extensions of the second thin-film resistor by a passivation layer.

8. The thin-film resistor assembly of claim 1 further comprising one or more resistive strips connected across the first thin-film resistor and the second thin-film resistor.

9. The thin-film resistor assembly of claim 8 wherein the resistive strips are disposed along and over the first main portion and the second main portion.

10. The thin-film resistor assembly of claim 9 wherein the resistive strips are configured to provide additional resistance between the first signal port and the second signal port.

11. An attenuator comprising:
a substrate;
a thin-film resistor assembly formed on a first surface of the substrate, the thin-film resistor assembly including
a first thin-film resistor disposed on a first surface of the substrate and including a first main portion extending from a first signal port to a second signal port and one or more extensions extending from the first main portion, a second thin-film resistor disposed on the first surface of the substrate and including a second main portion extending from the first signal port to the second signal port and one or more extensions extending from the second main portion, the first main portion separated from the second main portion by a separation region;

a plurality of contact pads formed on a second surface of the substrate opposite the first surface and configured to provide a reference potential to the one or more extensions of the first thin-film resistor and to the one or more extensions of the second thin-film resistor; and a metal layer formed on the second surface of the substrate and in electrical contact with the plurality of contact pads, the metal layer defining an opening that is substantially underneath the first main portion and the second main portion.

12. The attenuator of claim 11 further comprising a passivation layer substantially covering the thin-film resistor assembly.

13. The attenuator of claim 11 wherein the first thin-film resistor and the second thin-film resistor are substantially mirror images of each other about an axis that extends between the first signal port and the second signal port.

14. The attenuator of claim 11 mounted on a packaging substrate.

15. The attenuator of claim 14 wherein the packaging substrate includes a topside metal layer having an opening that overlaps at least in part with the metal layer.

16. A wireless device comprising:
an antenna; and
an attenuator module electrically connected to the antenna in a signal path of the wireless device, the attenuator module including a substrate, a first thin-film resistor disposed on a first surface of the substrate and including a first main portion extending from a first signal port to a second signal port and one or more extensions extending from the first main portion, a second thin-film resistor disposed on the first surface of the substrate and including a second main portion extending from the first signal port to the second signal port and one or more extensions extending from the second main portion, a plurality of contact pads formed on a second surface of the substrate and configured to provide a reference potential to the one or more extensions of the first thin-film resistor and to the one or more extensions of the second thin-film resistor, and at least one metal layer formed on the second surface of the substrate and in electrical contact with the plurality of contact pads, the first main portion separated from the second main portion, and the at least one metal layer defining an opening that is substantially underneath the first main portion and the second main portion.

17. The wireless device of claim 16 wherein the first thin-film resistor and the second thin-film resistor are substantially mirror images of each other about an axis that extends between the first signal port and the second signal port.

18. The wireless device of claim 16 wherein the first thin-film resistor and the second thin-film resistor each have a double-tee configuration.

19. The wireless device of claim 16 wherein the attenuator module further includes one or more resistive strips connected across the first thin-film resistor and the second thin-film resistor.

20. The wireless device of claim 19 wherein the resistive strips are disposed along and over the first main portion and the second main portion.

* * * * *